(12) United States Patent
Arceo de la Pena et al.

(10) Patent No.: US 9,799,534 B1
(45) Date of Patent: Oct. 24, 2017

(54) APPLICATION OF TITANIUM-OXIDE AS A PATTERNING HARDMASK

(71) Applicant: INTERNATIONAL BUSINESS MACHINES CORPORATION, Armonk, NY (US)

(72) Inventors: Abraham Arceo de la Pena, Albany, NY (US); Ekmini A. De Silva, Ossining, NY (US); Nelson M. Felix, Briarcliff Manor, NY (US); Sivananda K. Kanakasabapathy, Niskayuna, NY (US); Indira P. Seshadri, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/397,966

(22) Filed: Jan. 4, 2017

(51) Int. Cl.
| | |
|---|---|
| *H01L 21/00* | (2006.01) |
| *H01L 21/3213* | (2006.01) |
| *H01L 21/033* | (2006.01) |
| *H01L 21/027* | (2006.01) |
| *H01L 21/311* | (2006.01) |

(Continued)

(52) U.S. Cl.
CPC .... *H01L 21/32139* (2013.01); *H01L 21/0228* (2013.01); *H01L 21/0273* (2013.01); *H01L 21/02186* (2013.01); *H01L 21/02274* (2013.01); *H01L 21/0331* (2013.01); *H01L 21/0332* (2013.01); *H01L 21/0337* (2013.01); *H01L 21/31053* (2013.01); *H01L 21/31111* (2013.01); *H01L 21/31138* (2013.01); *H01L 21/31144* (2013.01); *H01L 29/66545* (2013.01)

(58) Field of Classification Search
CPC .......... H01L 21/32139; H01L 21/0332; H01L 21/0337; H01L 21/0331; H01L 21/0273; H01L 21/31138; H01L 21/31053; H01L 21/02186; H01L 21/02274; H01L 21/0228; H01L 21/3111; H01L 21/31144
See application file for complete search history.

(56) References Cited

U.S. PATENT DOCUMENTS

| | | |
|---|---|---|
| 7,196,015 B2 | 3/2007 | Chae et al. |
| 9,105,484 B2 | 8/2015 | Wei et al. |

(Continued)

FOREIGN PATENT DOCUMENTS

| | | |
|---|---|---|
| JP | 62003416 B | 1/1987 |
| JP | 62252944 A | 11/1987 |

(Continued)

*Primary Examiner* — Richard Booth
(74) *Attorney, Agent, or Firm* — Erik K. Johnson

(57) ABSTRACT

An organic planarization layer (OPL) is formed above a functional layer located on a substrate. A titanium-oxide layer is formed above the OPL, wherein forming the titanium-oxide layer comprises titanium, oxide, carbon, and nitrogen. A photoresist layer is patterned above a first portion of the titanium-oxide layer. A second portion of the titanium-oxide layer is removed using a wet stripping technique. The photoresist layer and the OPL are removed using a dry etch technique, wherein the first portion of the titanium-oxide layer remains over a remaining portion of the OPL. The first portion of the titanium-oxide layer and the functional layer are removed using the wet stripping technique. The remaining portion of the OPL is removed using a dry stripping technique.

20 Claims, 4 Drawing Sheets

(51) Int. Cl.
    *H01L 21/3105*     (2006.01)
    *H01L 21/02*     (2006.01)
    *H01L 29/66*     (2006.01)

(56) References Cited

U.S. PATENT DOCUMENTS

| | | | |
|---|---|---|---|
| 9,177,874 B2 * | 11/2015 | Patzer | ................ H01L 22/12 |
| 2004/0048194 A1 | 3/2004 | Breyta et al. | |
| 2007/0105390 A1 | 5/2007 | Oh | |
| 2015/0104938 A1 | 4/2015 | Tao et al. | |
| 2015/0131382 A1 | 5/2015 | Himeno | |
| 2015/0380251 A1 | 12/2015 | Glodde et al. | |

FOREIGN PATENT DOCUMENTS

| | | | |
|---|---|---|---|
| JP | 10223604 A | 8/1998 | |
| JP | 2000349253 A | 12/2000 | |
| JP | 20011274143 A | 10/2001 | |
| JP | 2012142574 A | 7/2012 | |
| JP | 2016128902 A | 7/2016 | |
| KR | 101623278 B1 | 5/2016 | |

\* cited by examiner

APPLICATION OF TITANIUM-OXIDE AS A PATTERNING HARDMASK

BACKGROUND OF THE INVENTION

The present invention relates generally to the field of manufacturing semiconductor devices, and more particularly to applying a solvent-strippable hardmask to enable selective removal of work function metal in a replacement metal gate (RMG) sector.

SUMMARY

Embodiments of the present invention provide methods of manufacturing a semiconductor structure. An organic planarization layer (OPL) is formed above a functional layer located on a substrate. A titanium-oxide layer is formed above the OPL, wherein forming the titanium-oxide layer comprises titanium, oxygen, carbon, and nitrogen. A photoresist layer is patterned above a first portion of the titanium-oxide layer. A second portion of the titanium-oxide layer is removed using a wet stripping technique. The photoresist layer and the OPL are removed using a dry etch technique, wherein the first portion of the titanium-oxide layer remains over a remaining portion of the OPL. The first portion of the titanium-oxide layer and the functional layer are removed using the wet stripping technique. The remaining portion of the OPL is removed using a dry stripping technique.

DETAILED DESCRIPTION

Figure 1A:
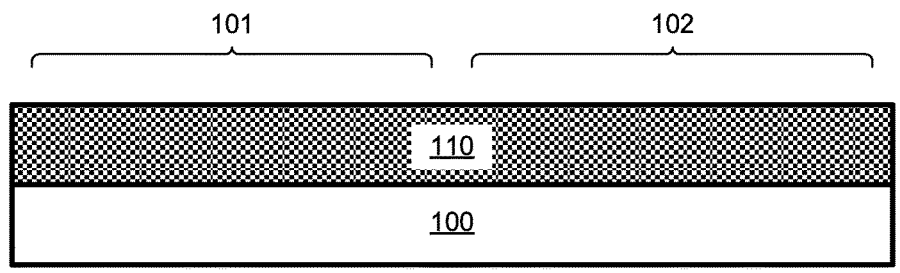
FIG. 1A is a side view depicting depositing a functional layer on a substrate, in accordance with an embodiment of the present invention.

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1A is a side view depicting depositing functional layer 110 on substrate 100, in accordance with an embodiment of the present invention. Substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, substrate 100 may be a bulk semiconductor substrate. In such embodiments, substrate 100 may be approximately, but is not limited to, several hundred microns thick. For example, substrate 100 may have a thickness ranging from approximately 0.5 mm to approximately 1.5 mm. In other embodiments, substrate 100 may be a semiconductor-on-insulator (SOI) substrate, where a buried insulator layer (not shown) separates a base substrate (not shown) from a top semiconductor layer. In other embodiments where a finFET structure is being fabricated, substrate 100 may be a semiconductor fin. Additionally, substrate 100 may include region 101 and region 102 (e.g., containing either NFET or PFET gates).

Functional layer 110 may be formed on a semiconductor substrate 100. Functional layer 110 may be a thin-metal layer made from a material that can be dry etched, including, but not limited to, including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. In another embodiment, functional layer 110 may be made from another material, such as, for example, dielectric materials, or any of several known oxides or oxynitrides derived from a semiconductor material. Semiconductor materials may include any elemental semiconductor known in the art, an alloy of at least two elemental semiconductor materials, a III-V compound semiconductor material, a II-VI compound semiconductor material, or any combination thereof. In an exemplary embodiment, the semiconductor material may be silicon. For example, functional layer 110 may be made of silicon oxide or silicon oxynitride. Functional layer 110 may have a thickness, for example, ranging from approximately 1 nm to approximately 10 nm, preferably ranging from approximately 2 nm to approximately 4 nm. However, greater and lesser thicknesses of functional layer 110 are explicitly contemplated.

In some embodiments, functional layer 110 is deposited to form a gate dielectric of one or more FET structures. In an exemplary embodiment, deposition of functional layer 110 may be performed by any suitable deposition technique such as, for example, atomic layer deposition (ALD), chemical vapor deposition (CVD), plasma enhanced CVD, spin-on deposition, or physical vapor deposition (PVD). In other embodiments, functional layer 110 may be grown on substrate 100 using any known process.

Figure 1B:
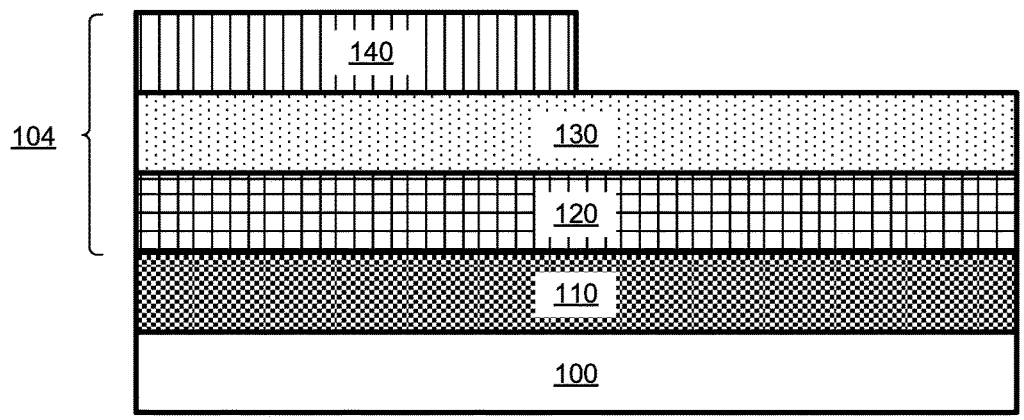
FIG. 1B is a side view depicting depositing a masking layer stack to the selectively deposition layer, in accordance with an embodiment of the present invention.

FIG. 1B is a side view depicting depositing masking layer stack 104 to functional layer 110, in accordance with an embodiment of the present invention. Masking layer stack 104 may be deposited on functional layer 110 to allow selective etching or removal of functional layer 110 over region 102, while preserving functional layer 110 over region 101. The masking layer stack 104 may include, for example, an organic planarization layer (OPL) 120, titanium-oxide hardmask 130, and photoresist layer 140. Masking layer stack 104 may be formed by any suitable deposition technique or techniques known in the art, including, for example, ALD, CVD, PVD, liquid source misted chemical deposition (LSMCD), pulsed laser deposition (PLD), and molecular beam deposition (MBD). OPL 120 may be included to form a level surface for deposition of additional layers. Accordingly, OPL 120 may have any thickness suitable to cover functional layer 110 and have a substantially flat top surface.

Figure 1C:
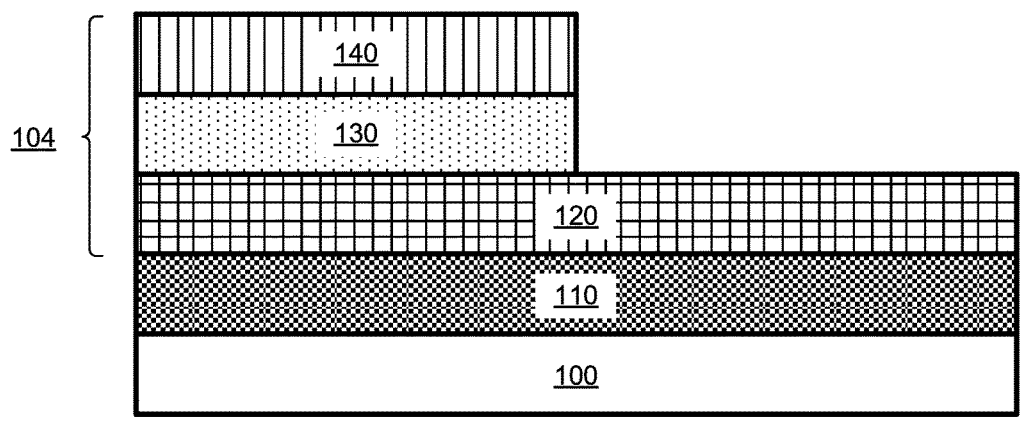
FIG. 1C is a side view depicting removing the titanium-oxide hardmask, in accordance with an embodiment of the present invention.
Figure 1D:
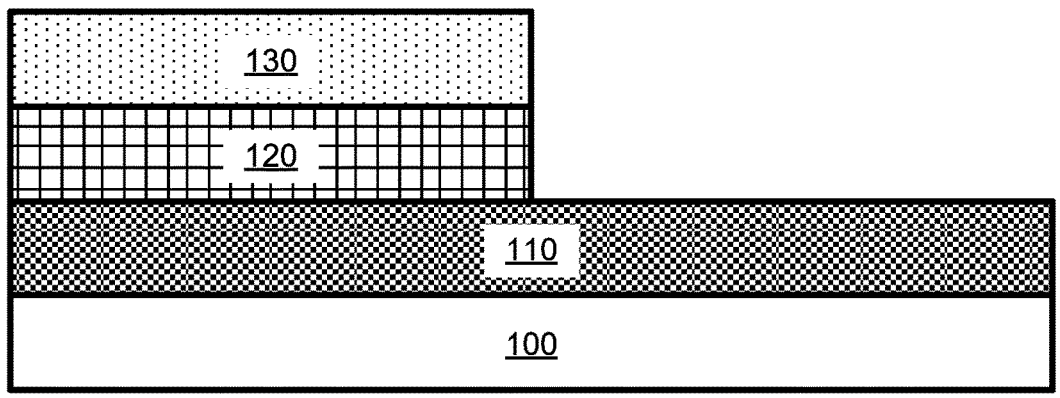
FIG. 1D is a side view depicting removing an organic planarization layer (OPL) and a photoresist layer, in accordance with an embodiment of the present invention.
Figure 1E:
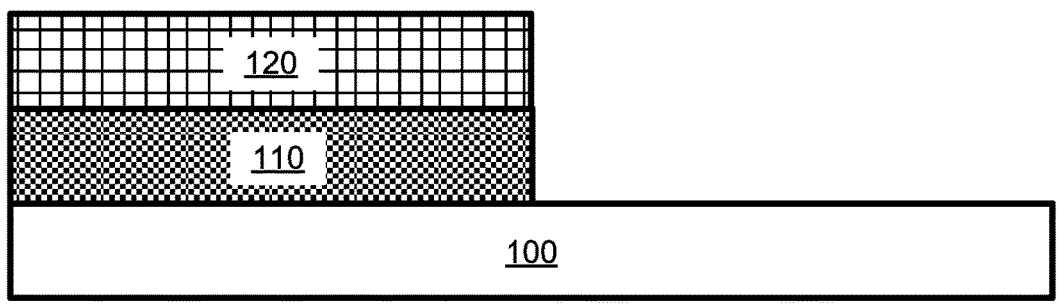
FIG. 1E is a side view depicting removing the titanium-oxide hardmask and the selectively deposition layer, in accordance with an embodiment of the present invention.
Figure 1F:
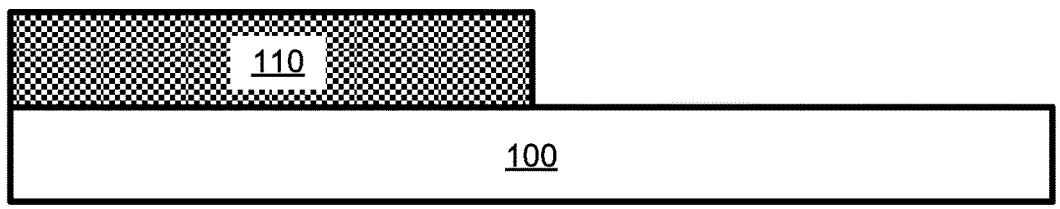
FIG. 1F is a side view depicting removing the OPL, in accordance with an embodiment of the present invention.

Titanium-oxide hardmask 130 is a material that may be completely removed using wet stripping techniques, such as SC-1, as described in greater detail with regard to FIGS. 1C and 1F. For example, a first step in a standard set of wafer cleaning steps may involve an organic clean and particle clean process known as Standard Clean 1 (SC-1). Titanium-oxide hardmask 130 may also be a material facilitating as an etch-stop when removing OPL 120 from masking layer stack 104 using etching techniques, such as N2/H2 etching, as described in greater detail with regard to FIG. 1E. Accordingly, implementing titanium-oxide hardmask 130 enables to selectively remove portions of functional layer 110 through dry stripping techniques, as described in greater detail with regard to FIG. 1F. In this embodiment, titanium-oxide (TiOx) hardmask 130 is a material that includes carbon (C) and nitrogen (N) to improve a removal rate of titanium-oxide hardmask 130. The introduction of C and N to the film composition of titanium-oxide hardmask 130 reduces a density of the film composition, whereby increases a wet strip rate.

In an example embodiment, titanium-oxide hardmask 130 ranges may be between 5-15% atomic weight C, 1-10% atomic weight N, 28-32% atomic weight Ti, and 55-60% atomic weight O. The introduction of C and O in titanium-oxide hardmask 130 reduces a density of titanium-oxide hardmask 130, whereby allowing for more effective removal. A wet etch rate of titanium-oxide hardmask 130 is a function of an amount of C and N introduced in titanium-oxide hardmask 130 during formation of titanium-oxide hardmask 130. In one embodiment, adding too much C and O to titanium-oxide hardmask 130 may reduce the etch selectivity when acting as an etch-stop to OPL 120, where OPL 120 is a carbon underlayer. For example, titanium-oxide hardmask 130 having a film composition of 1.8% atomic weight N and 5.6% atomic weight C has a wet etch rate of 0.5 nm/min, which is slower compared to a film composition of 10.3% atomic weight N and 15.4 atomic weight C having a wet etch rate of 4.5 nm/min. The formation of titanium-oxide hardmask 130 includes the introduction of C and N constituents to the film composition from a precursor during plasma-enhanced atomic layer deposition (PEALD) processing. In an example embodiment, Titanium-oxide hardmask 130 may be deposited at a thickness as low as 4 nm.

Titanium-oxide hardmask 130 may be deposited between OPL 120 and photoresist layer 140. Deposition of titanium-oxide hardmask 130 may be performed by any suitable deposition technique such as, for example, PEALD, PECVD, and PVD, at temperatures less than a thermal budget of OPL 120. The deposition process may be performed using a starting precursor having Ti, O, C and N in the deposition chamber. Additionally, parameters related to deposition may be altered in order to improve the wet etch rate of the resulting structure. For example, in PEALD deposition, lowering deposition temperature, radio-frequency (RF) power, and RF time (e.g., a time duration for deposition) may each increase the amount of Carbon and Nitrogen contained in the functional layer 110, which may increase the wet etch rate. In this embodiment, a wet etch rate is a function of the various parameters for deposition of titanium-oxide hardmask 130, whereby a lower RF power and RF time increases the wet strip rate.

Accordingly masking layer stack 104 may be removed to expose a portion of functional layer 110 in region 102, as described in greater detail below. Prior to etching, photoresist layer 240 is patterned, using known lithographic patterning techniques, to the desired structure. Etching masking layer stack 104 may be accomplished through any combination of known techniques, such as, for example, RIE, wet stripping and plasma etching.

FIG. 1C is a side view depicting removing titanium-oxide hardmask 130, in accordance with an embodiment of the present invention. As previously described, removing titanium-oxide hardmask 130 may be performed using any wet stripping process involved with standard SC-1 chemistry at room temperature. In another embodiment, wet stripping with standard DHF chemistry, at varying DHF compositions, at room temperature may be used to remove titanium-oxide hardmask 130.

FIG. 1D is a side view depicting removing OPL 120 and photoresist layer 140, in accordance with an embodiment of the present invention. As previously described, prior to etching, photoresist layer 140 is patterned, using known lithographic patterning techniques, to the desired structure. Removing OPL 120 may be accomplished through any combination of known techniques, such as, for example, N2/H2 etching, where titanium-oxide hardmask 130 facilitates as the etch-stop.

FIG. 1E is a side view depicting removing titanium-oxide hardmask 130 and functional layer 110, in accordance with an embodiment of the present invention. Removal of the titanium-oxide hardmask 130 may occur during, or following, the selective stripping of functional layer 110 from region 102. Removal of titanium-oxide hardmask 130 and functional layer 110 may be accomplished through any combination of known techniques, such as, for example, wet stripping with SC-1 and DHF at room temperature. In this embodiment, a higher wet strip rate of titanium-oxide hardmask 130 is achieved by increasing an amount of C and N content of titanium-oxide hardmask 130. In this embodiment, the remaining portion of OPL 120 contains no presence of a titanium-oxide material from titanium-oxide hardmask 130.

FIG. 1F is a side view depicting removing OPL 120, in accordance with an embodiment of the present invention. Removing a remaining portion of OPL 120 may be accomplished through any combination of known dry stripping techniques such as, for example, $N_2/H_2$ RIE or Ashing can be used to remove OPL 120.

Figure 2A:
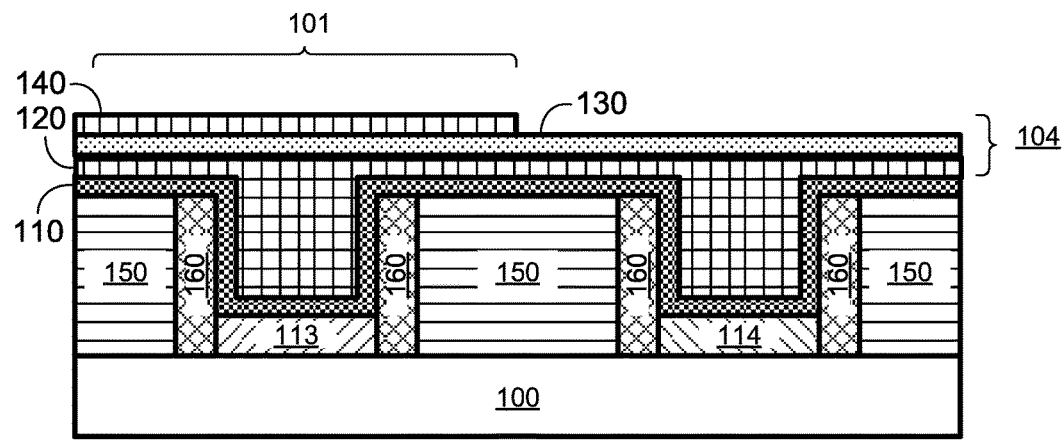
FIG. 2A is a side view depicting depositing a masking layer stack to the selectively deposition layer, in accordance with an embodiment of the present invention.

FIG. 2A is a side view depicting depositing masking layer stack 104 to pattern functional layer 110, in accordance with an embodiment of the present invention. Masking layer stack 104 may be deposited on functional layer 110 to allow selective etching of functional layer 110 over region 102, while preserving functional layer 110 over region 101. The masking layer stack 104 may include, for example, an organic planarization layer (OPL) 120, titanium-oxide hardmask 130, and photoresist layer 140. Masking layer stack 104 may be formed by any suitable deposition technique or techniques known in the art, including, for example, ALD, CVD, PVD, MBD, PLD, and LSMCD. OPL 120 may be included to form a level surface for deposition of additional layers. Accordingly, OPL 120 may have any thickness suitable to cover functional layer 110 and have a substantially flat top surface.

In this embodiment, second layer 114 may include patterning region 101 of the structure with photoresist layer 140. Masking of region 101 is accomplished by depositing functional layer 110 above first layer 113, covering a portion of functional layer 110 with masking layer stack 104 and selectively etching away the material covering region 102, while leaving functional layer 110 above region 101, as described in FIG. 2E.

Figure 2B:
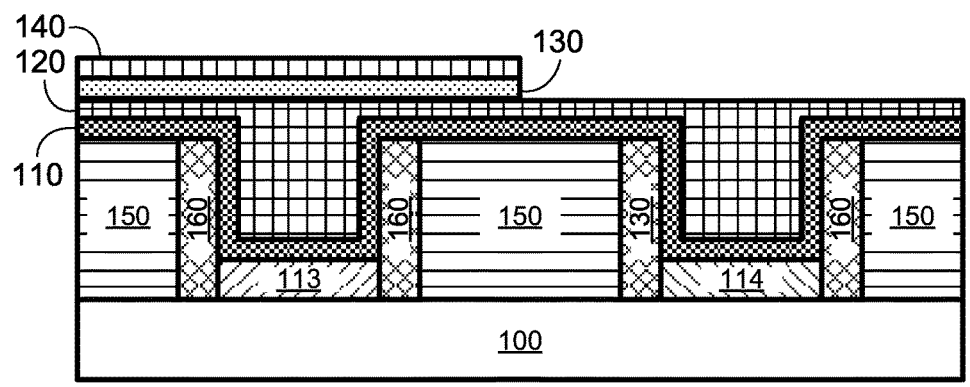
FIG. 2B is a side view depicting removing the titanium-oxide hardmask, in accordance with an embodiment of the present invention.

FIG. 2B is a side view depicting removing titanium-oxide hardmask 130, in accordance with an embodiment of the present invention. As previously described, removing titanium-oxide hardmask 130 may be performed using any wet stripping process involved with standard SC-1 chemistry at room temperature. In another embodiment, wet stripping with standard DHF chemistry, at varying DHF compositions, at room temperature may be used to remove titanium-oxide hardmask 130.

Figure 2C:
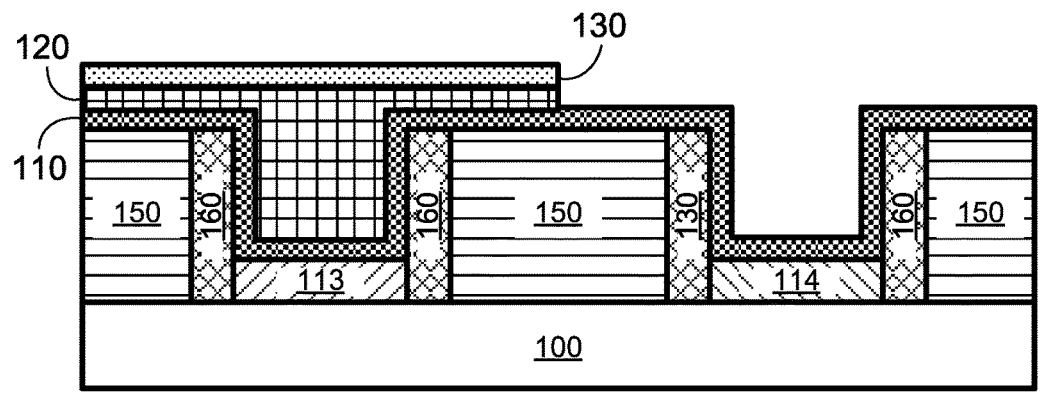
FIG. 2C is a side view depicting removing an OPL and a photoresist layer, in accordance with an embodiment of the present invention.

FIG. 2C is a side view depicting removing OPL 120 and photoresist layer 140, in accordance with an embodiment of the present invention. As previously described, prior to etching, photoresist layer 140 is patterned, using known lithographic patterning techniques, to the desired structure. Removing OPL 120 may be accomplished through any combination of known techniques, such as, for example, N2/H2 etching, where titanium-oxide hardmask 130 facilitates as the etch-stop.

Figure 2D:
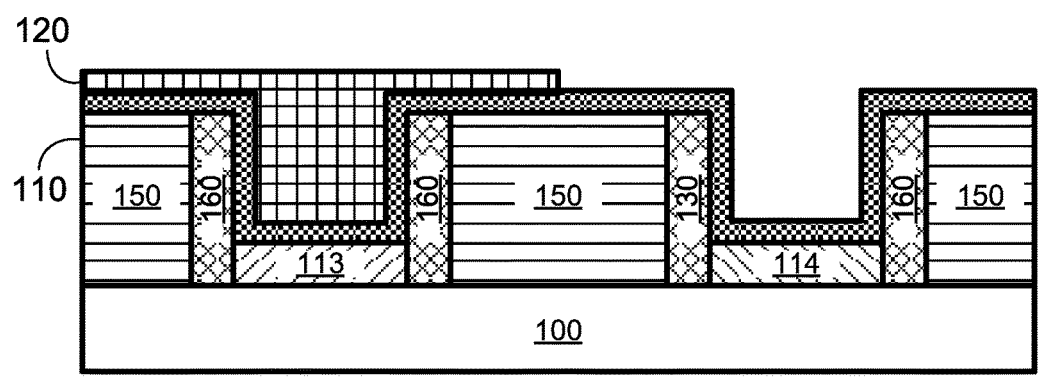
FIG. 2D is a side view depicting removing the titanium-oxide hardmask and the selectively deposition layer, in accordance with an embodiment of the present invention.

FIG. 2D is a side view depicting removing titanium-oxide hardmask 130, in accordance with an embodiment of the present invention. As previously described, removing titanium-oxide hardmask 130 may be performed using any wet stripping process involved with standard SC-1 chemistry at room temperature. In another embodiment, wet stripping with standard DHF chemistry, at varying DHF compositions, at room temperature may be used to remove titanium-oxide hardmask 130.

Figure 2E:
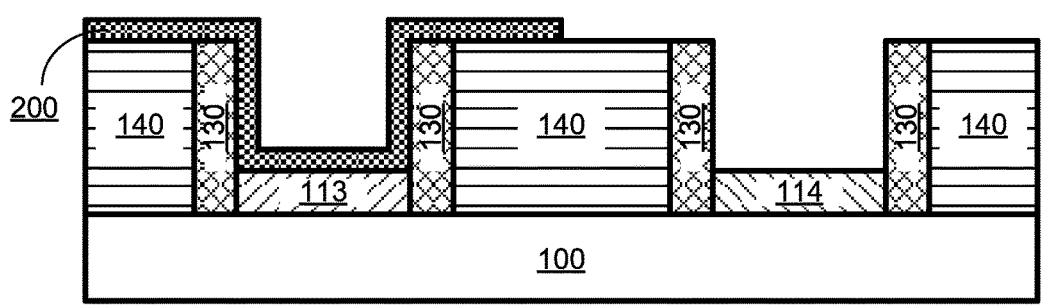
FIG. 2E is a side view depicting removing the OPL, in accordance with an embodiment of the present invention.

FIG. 2E is a side view depicting removing titanium-oxide hardmask 130 and functional layer 110, in accordance with an embodiment of the present invention. Removal of the titanium-oxide hardmask 130 may occur during, or following, the selective stripping of functional layer 110 from region 102. Removal of titanium-oxide hardmask 130 and functional layer 110 may be accomplished through any combination of known techniques, such as, for example, wet stripping with SC-1 and DHF at room temperature. In this embodiment, a higher wet strip rate of titanium-oxide hardmask 130 is achieved by increasing an amount of C and N content of titanium-oxide hardmask 130. In this embodiment, the remaining portion of OPL 120 contains no presence of a titanium-oxide material from titanium-oxide hardmask 130.

FIG. 2F is a side view depicting removing OPL 120, in accordance with an embodiment of the present invention. Removing a remaining portion of OPL 120 may be accomplished through any combination of known dry stripping techniques such as, for example, $N_2/H_2$ RIE or Ashing can be used to remove OPL 120.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of manufacturing a semiconductor structure, the method comprising:
    forming an organic planarization layer (OPL) above a functional layer located on a substrate;
    forming a titanium-oxide layer above the OPL, wherein forming the titanium-oxide layer comprises titanium, oxygen, carbon, and nitrogen;
    patterning a photoresist layer above a first portion of the titanium-oxide layer;
    removing a second portion of the titanium-oxide layer using a wet stripping technique;
    removing the photoresist layer and the OPL using a dry etch technique, wherein the first portion of the titanium-oxide layer remains over a remaining portion of the OPL;
    removing the first portion of the titanium-oxide layer and the functional layer using the wet stripping technique; and removing the remaining portion of the OPL using a dry stripping technique.

2. The method of claim 1, wherein the titanium-oxide layer has a film composition comprising 5-15 atomic weight % carbon, 1-10 atomic weight % nitrogen, 28-32 atomic weight % titanium, and 55-60 atomic weight % oxygen.

3. The method of claim 1, wherein the density of the titanium-oxide layer is less than the density of a titanium-oxide material.

4. The method of claim 1, wherein the titanium-oxide layer is removable using the wet stripping technique and the titanium-oxide layer is an etch-stop during the removal of the OPL layer using the dry etch technique.

5. The method of claim 1, wherein the remaining portion of the OPL contains essentially no material from the titanium-oxide layer.

6. The method of claim 1, wherein forming the titanium-oxide layer above the OPL comprises:
performing a deposition technique selected from a group deposition techniques consisting of: atomic layer deposition (ALD), chemical vapor deposition (CVD), plasma enhanced CVD, physical vapor deposition (PVD), liquid source misted chemical deposition (LSMCD), pulsed laser deposition (PLD), and molecular beam deposition (MBD), to deposit the titanium-oxide layer from a precursor above the OPL.

7. The method of claim 1, wherein forming the titanium-oxide layer above the OPL comprises:
performing a plasma-enhanced atomic layer deposition (PEALD) technique to deposit the titanium-oxide layer above the OPL.

8. The method of claim 3, wherein a wet etch rate of the titanium-oxide layer is greater than the wet etch rate of the titanium-oxide material.

9. The method of claim 7, wherein a radio frequency (RF) power during depositing the titanium-oxide layer using the PEALD technique is performed at a power of about 50 to about 200 watts.

10. The method of claim 7, wherein a time duration for depositing the titanium-oxide layer from the precursor the PEALD technique is performed at a RF time of about 0.2 to about 0.4 seconds.

11. The method of claim 7, wherein a temperature for depositing the titanium-oxide layer from the precursor the PEALD technique is less than a thermal budget of the OPL.

12. The method of claim 8, wherein the titanium-oxide layer is removed at a wet etch rate of about 0.5 nm/min to about 4.5 nm/min.

13. A method of manufacturing a semiconductor structure, the method comprising:
forming an organic planarization layer (OPL) above a functional layer located on a substrate;
forming a titanium-oxide layer above the OPL, wherein forming the titanium-oxide layer comprises titanium, oxygen, carbon, and nitrogen;
selectively patterning a photoresist layer above a first portion of the titanium-oxide layer;
selectively removing a second portion of the titanium-oxide layer using a SC-1 wet stripping technique;
selectively removing the photoresist layer and the OPL using a $N_2/H_2$ dry etch technique, wherein the first portion of the titanium-oxide layer remains over a remaining portion of the OPL;
selectively removing the first portion of the titanium-oxide layer and the functional layer using the SC-1 wet stripping technique, wherein the remaining portion of the OPL contains essentially no material from the titanium-oxide layer, and wherein a wet etch rate of the titanium-oxide layer is increased by reducing a density of the titanium-oxide layer; and
selectively removing the remaining portion of the OPL using a dry stripping technique.

14. The method of claim 13, wherein the titanium-oxide layer has a film composition comprising 5-15 atomic weight % carbon, 1-10 atomic weight % nitrogen, 28-32 atomic weight % titanium, and 55-60 atomic weight % oxygen.

15. The method of claim 13, wherein the density of the titanium-oxide layer is less than the density of a titanium-oxide material.

16. The method of claim 13, wherein the titanium-oxide layer is removable using the wet stripping technique and the titanium-oxide layer is an etch-stop during the removal of the OPL layer using the dry etch technique.

17. The method of claim 13, wherein forming the titanium-oxide layer above the OPL comprises:
performing a deposition technique selected from a group deposition techniques consisting of: atomic layer deposition (ALD), chemical vapor deposition (CVD), plasma enhanced CVD, physical vapor deposition (PVD), liquid source misted chemical deposition (LSMCD), pulsed laser deposition (PLD), and molecular beam deposition (MBD), to deposit the titanium-oxide layer from a precursor above the OPL.

18. The method of claim 13, wherein forming the titanium-oxide layer above the OPL comprises:
performing a plasma-enhanced atomic layer deposition (PEALD) technique to deposit the titanium-oxide layer from above the OPL.

19. The method of claim 13, wherein the wet etch rate of the titanium-oxide layer is greater than the wet etch rate of the titanium-oxide material.

20. The method of claim 18, wherein a radio frequency (RF) power during depositing the titanium-oxide layer from using the PEALD technique is performed at a power of about 50 to about 200 watts.

* * * * *